United States Patent [19]

Policastro et al.

[11] 4,393,572
[45] Jul. 19, 1983

[54] METHOD OF MAKING LOW LEAKAGE N-CHANNEL SOS TRANSISTORS UTILIZING POSITIVE PHOTORESIST MASKING TECHNIQUES

[75] Inventors: Steven G. Policastro, Readington Township, Hunterdon County; Dae-Shik Woo, Hillsborough Township, Somerset County, both of N.J.

[73] Assignee: RCA Corporation, New York, N.Y.

[21] Appl. No.: 154,601

[22] Filed: May 29, 1980

[51] Int. Cl.³ .................... H01L 21/86; H01L 21/20
[52] U.S. Cl. .......................... 29/571; 29/578; 29/579; 148/1.5; 148/175; 148/187; 156/649; 156/659.1; 357/4; 357/23 TF; 357/52; 357/56
[58] Field of Search .................. 148/1.5, 175, 187; 29/571, 578, 579; 156/649, 659.1, 662; 430/313, 314, 317; 357/4, 23 TF, 52, 56

[56] References Cited

U.S. PATENT DOCUMENTS

| | | | |
|---|---|---|---|
| 3,740,280 | 6/1973 | Ronen | 357/49 X |
| 3,890,632 | 6/1975 | Ham et al. | 357/23 TF |
| 4,070,211 | 1/1978 | Harari | 148/187 |
| 4,174,217 | 11/1979 | Flatley | 156/659.1 X |
| 4,178,191 | 12/1979 | Flatley | 148/1.5 |
| 4,242,156 | 12/1980 | Peel | 148/175 |
| 4,277,884 | 7/1981 | Hsu | 29/571 |

*Primary Examiner*—W. G. Saba
*Attorney, Agent, or Firm*—Birgit E. Morris; Donald S. Cohen; Lawrence P. Benjamin

[57] ABSTRACT

A self-aligned method of implanting the edges of NMOS/SOS transistors is described. The method entails covering the silicon islands with a thick oxide layer, applying a protective photoresist layer over the thick oxide layer, and exposing the photoresist layer from the underside of the sapphire substrate thereby using the island as an exposure mask. Only the photoresist on the islands' edges will be exposed. The exposed photoresist is then removed and the thick oxide is removed from the islands edges which are then implanted.

8 Claims, 5 Drawing Figures

METHOD OF MAKING LOW LEAKAGE N-CHANNEL SOS TRANSISTORS UTILIZING POSITIVE PHOTORESIST MASKING TECHNIQUES

The invention described herein was made in the performance of work under NASA Contract No. NAS8-31986 and is subject to the provisions of Section 305 of the National Aeronautics and Space Act of 1958, (72 Stat. 435; 42 U.S.C. 2457).

BACKGROUND OF THE INVENTION

The present invention relates to integrated circuits, particularly to integrated circuits manufactured using silicon-on-sapphire (SOS) technology.

A problem has heretofore existed in controlling the leakage of the N-channel (NMOS) transistor in complementary symmetry metal oxide semiconductor (CMOS) SOS integrated circuits or in NMOS/SOS integrated circuits when the threshold voltage of the NMOS transistor is very low. The reason for the problem's existence is that every open geometry, i.e. non $C^2L$, transistor manufactured using SOS technology really consists of three transistors in parallel. The three transistors are a top transistor manufactured on the flat upper surface of the silicon island, i.e. on a silicon surface which is parallel to the (100) crystallographic plane and a pair of "edge transistors" which are manufactured on the edge of the island, i.e. on a silicon surface parallel to the (111) crystallographic plane. Since the edge transistors on the (111) silicon have a threshold voltage approximately 0.7 volts to 1.0 volt lower than the top transistor, there is normally no problem when the integrated circuit is operated from a standard power supply voltage in the range of from 5 to 10 volts. The reason that there is normally no problem is that the top N-channel transistor threshold is generally set to be at least 1.5 volts, so the edge transistors are turned off when the top transistor is turned off. However, there will be a problem if the threshold voltage of the top transistor is reduced to below about 1.0 volt for low voltage operation. There will also be a problem if the N-channel transistors' thresholds shift due to radiation exposure. Then, the associated shift in the threshold voltage of (111) edge transistors is even greater than that of the top transistor, and the shift can cause the edge transistors to go well into the depletion range. The shift in threshold voltage of the edge transistors is a major cause of post-radiation leakage current in SOS arrays.

In order to avoid the problems set forth above, the edge transistor leakage could be controlled by providing a guardband, i.e. a heavily doped region, around the edge of the island in order to raise the threshold voltage of the edge transistors by increasing their surface impurity concentrations. This has generally not been done in the past, because no way of doing it which would not consume extra area and involve an additional photomask step was known heretofore.

Heretofore various approaches have been utilized in manufacturing low leakage NMOS/SOS transistors. Such approaches are described more fully in U.S. Pat. No. 3,890,632 entitled STABILIZED SEMICONDUCTOR DEVICES AND METHOD OF MAKING SAME, which issued to W. E. Ham et al. on June 17, 1975; U.S. Pat. No. 4,178,191 entitled PROCESS OF MAKING A PLANAR MOS SILICON-ON-INSULATING SUBSTRATE DEVICE, which issued to D. W. Flatley on Dec. 11, 1979; U.S. Pat. No. 4,070,211 entitled TECHNIQUE FOR THRESHOLD CONTROL OVER EDGES OF DEVICES ON SILICON-ON-SAPPHIRE, which issued to E. Harari on Jan. 24, 1978; and co-pending U.S. patent application No. 093,011 entitled LOW LEAKAGE N-CHANNEL SOS TRANSISTORS AND METHOD OF MAKING THEM OF J. J. Fabula which issued on Feb. 24, 1981 as U.S. Pat. No. 4,252,574. Each of the aforementioned patents and patent application is incorporated herein by reference.

SUMMARY OF THE INVENTION

The threshold voltage of the parasitic NMOS edge transistors is increased by increasing the well implant dosage at the edges of the NMOS epitaxial islands. To be effective, the increased ion implantation must go only into the edges of the NMOS transistors. Accordingly, a precise alignment is required. In accordance with the invention, a self-aligned technique for defining an ion implantation mask comprises the deposition of a thick oxide over the epitaxial islands. The oxide film must be thick enough to shield the upper surface of the island from the implant. The oxide film is coated with positive photoresist which is exposed from the back of the sapphire wafer, thereby using the epitaxial silicon island as a self-aligned mask in the definition of the photoresist layer.

The exposed photoresist is developed and used as a mask in the etching of the silicon dioxide film. Careful over-etching of the oxide layer results in the edge of the epitaxial island extending beyond the edge of the oxide layer. The edge implantation is then performed.

DETAILED DESCRIPTION OF AN EXEMPLARY EMBODIMENT

Figure 1:
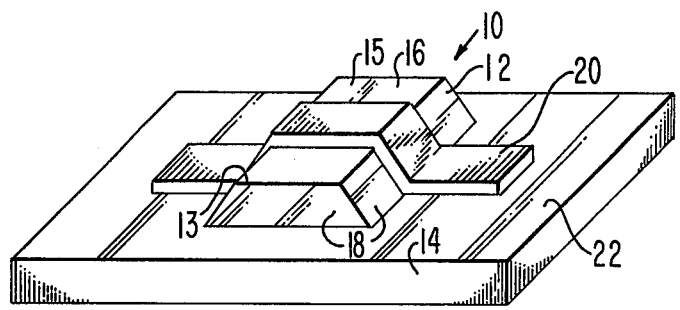
FIG. 1 is a perspective view of the transistor manufactured in accordance with the present invention.

Referring now to FIG. 1, a silicon-on-sapphire (SOS) N-channel MOS transistor 10 is shown. The configuration of the transistor 10 is standard in that the transistor 10 comprises an island 12 of epitaxial silicon material formed on the surface 22 of a sapphire substrate 14 in the conventional manner. The transistor 10 comprises a source 13, a drain 15, and a gate 20 which overlies a channel region. Both the source 13 and the drain 15 are of heavily doped N-type material, and the channel region (not shown), which underlies the gate 20, is of lightly doped P type material. The entire surface of the epitaxial silicon island 12 is covered with a thin silicon dioxide layer through which contact openings (not shown) can be made to provide contact to the source 13 and to the drain 15. The oxide layer also acts as the gate dielectric of the transistor 10, as is well-known in the art.

In view of the manner in which the silicon island 12 is formed, namely by etching, the edges 18 of the island 12 have planes which are parallel to the (111) crystallographic plane, whereas the top surface 16 of the island 12 is parallel to the (100) crystallographic plane. As is known in the art, transistors formed on the (111) silicon plane have lower threshold voltages than transistors formed on the (100) silicon plane, assuming that all other things are equal. In order to increase the threshold voltage of the edge transistors, the edges 18 of the silicon island 12, manufactured in accordance with the present invention, are made to have a higher surface concentration of acceptor impurities than the surface 16 of the silicon island 12.

Figure 2:
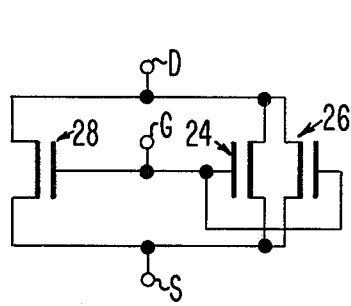
FIG. 2 is an electrical schematic representation of the transistor of FIG. 1.

With reference to FIG. 2, the transistor 10 can be modeled as a top transistor 28 in parallel with a pair of edge transistors 24, 26. The edge transistors 24, 26 are formed on the (111) edges 18 of the island 12, whereas the top transistor 28 is formed on the (100) top surface 16 of the island 12. The increased surface concentration of acceptor impurities in the edges 18 relative to the top surface 16 serves to increase the threshold voltage of the edge transistors 24, 26 relative to the top transistor 28.

Figure 3:
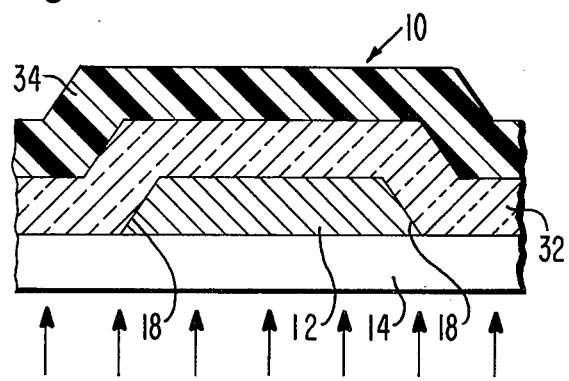
FIGS. 3-5 are cross-sectional views illustrating the method of the present invention.
Figure 4:
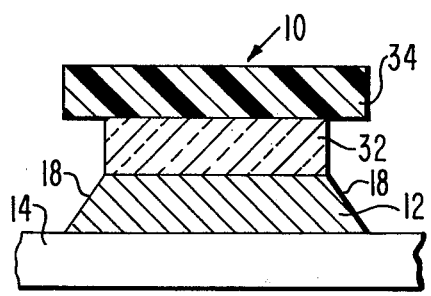
Figure 5:
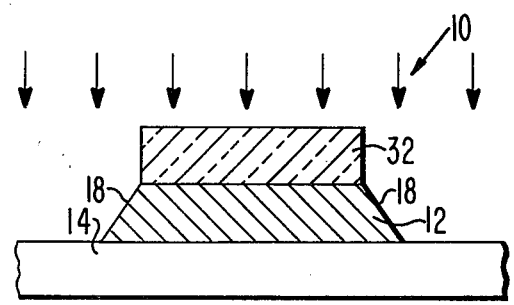

Referring now to FIGS. 3–5, the method of the present invention will be explained. The structure shown in FIG. 3 comprises a partially completed silicon-on-sapphire transistor 10 in the middle of a standard processing sequence, of the type well-known in the art. The structure 10 comprises a sapphire substrate 14 having a silicon layer 12 epitaxially grown thereon. The epitaxial layer is defined into silicon islands by using a standard photolithography step. Typically, a masking oxide layer is thermally grown on the surface of the silicon layer. Then, a photoresist layer is deposited, defined, and developed. The developed photoresist layer is then used as an etch mask for defining the silicon dioxide layer. Then the defined silicon dioxide layer is used as a masking layer in an etch of the underlying silicon epitaxial layer, thereby leaving islands where transistors will be formed.

A silicon dioxide layer 32, preferably of deposited silicon dioxide, and having a thickness of between about 6000 angstroms and 10,000 angstroms is formed over the surface of the silicon island 12 and the surface of the sapphire substrate 14 in any standard manner. A layer 34 of a positive photoresist material overlies the silicon dioxide layer 32.

The structure 10 is subjected to an exposure of ultraviolet light from the underside of the substrate, i.e. through the wafer, (represented by the arrows in FIG. 3). The back exposure exposes the photoresist layer 34 through the sapphire substrate 14 and through the silicon dioxide layer 32. However, the back exposure is selected to have an intensity and duration such that it will not expose the portions of the photoresist layer 34 which overlie the silicon island 12. Thus, the photoresist layer 34 will be exposed above areas of the sapphire substrate 14 having no epitaxial silicon islands 12 thereon, and the photoresist layer 34 will be partially exposed over the edges 18 of the epitaxial island 12.

Following the exposure of the photoresist layer 34, the photoresist layer 34 is developed and used as an etch mask in etching the silicon dioxide layer 32. Following the etch, which is typically conducted in buffered hydroflouric acid (HF), during which there will be undercutting of the developed photoresist etch mask 34, the structure will appear as shown in FIG. 4.

Next, the photoresist layer 34 is removed, and the silicon dioxide layer 32 is used as an implantation mask during the ion implantation of impurities such as boron, into the edges 18 of the silicon island 12 as shown in FIG. 5. We have found that a dose of $1.5 \times 10^{12}$ ions/cm$^2$ at an energy level of 50 KeV is effective to reduce the edge leakage of the NMOS transistors.

At this point, normal SOS processing is resumed. Typically, the oxide layer 32 will be stripped. Then, a new oxide layer (the gate oxide) will be grown over the surface of the island 12. The gate 20, typically of doped polycrystalline silicon will be applied, defined, and doped to make it conductive. Then, contact openings will be formed to allow contact to the source 13 and drain 15. A metallization layer will then be applied and defined, and a protective oxide will be formed thereover. Finally, bond pad openings will be formed in the protective oxide layer in the standard manner.

We claim:

1. An improved method for forming an SOS FET device having source and drain regions of a given conductivity type, comprising the steps of:
   (i) epitaxially growing a silicon layer on the top side of a sapphire substrate;
   (ii) forming a masking layer on the surface of the silicon layer, the masking layer covering the area of the silicon layer where at least one island which will be used for forming a transistor is located; and
   (iii) removing the portions of the epitaxial silicon layer which are not under the masking layer in order to leave the islands on the top side of the sapphire substrate;
   wherein the improvement comprises:
   (a) forming a transparent masking layer over the surface of the silicon island and the exposed portions of the sapphire substrate between the islands;
   (b) applying a positive photoresist layer over the top surface of the transparent masking layer;
   (c) exposing the photoresist layer from the underside of the substrate, whereby only those portions of the photoresist layer which overlie the edges of the islands and those portions of the photoresist layer which lie between the islands will be exposed, but only those portions of the photoresist layer which overlie the top surface of the islands will not be exposed through the islands;
   (d) developing the photoresist layer;
   (e) removing only those portions of the transparent masking layer which are on the sides of and between the islands that are exposed when the photoresist layer is developed;
   (f) removing the photoresist layer remaining on the unremoved portions of the transparent masking layer; and
   (g) implanting conductivity modifying ions of a type opposite to that of the source and drain regions into the exposed edges of the islands.

2. The method of claim 1, wherein:
   The SOS FET device is an N-Channel transistor; and the implanted conductivity modifying ions are boron.

3. The method of claim 1 wherein said step of forming a transparent masking layer over the surface of said islands comprises forming a silicon dioxide layer over the surface of said islands.

4. The method of claim 3 wherein said step of forming a silicon dioxide layer over the surface of said islands is accomplished by the thermal oxidation of the silicon islands.

5. The method of claim 3 wherein said step of forming a silicon dioxide layer over the surface of said islands is accomplished by depositing a silicon dioxide layer over the surface of said islands and said substrate.

6. The method of claim 1 wherein the step of removing the portions of said transparent masking layer which are exposed when said photoresist layer is developed is accomplished by etching.

7. The method of claim 6 wherein said transparent masking layer is comprised of silicon dioxide, and said step of removing portions thereof is accomplished by etching in a solution of buffered hydroflouric acid (HF).

8. The method of claim 7 wherein said step of removing portions of the transparent masking layer includes etching for a time sufficient to undercut said developed photoresist layer.

* * * * *